United States Patent [19]

Ocker et al.

[11] Patent Number: 5,536,380
[45] Date of Patent: Jul. 16, 1996

[54] LARGE AREA SPUTTER CATHODE HAVING FLOATING TARGET SEGMENTS

[75] Inventors: Berthold Ocker, Hanau; Reiner Hinterschuster, Hammersbach, both of Germany

[73] Assignee: Leybold Aktiengesellschaft, Hanau, Germany

[21] Appl. No.: 448,129

[22] Filed: May 23, 1995

[30] Foreign Application Priority Data

Jul. 28, 1994 [DE] Germany ............................ 44 26 751.7

[51] Int. Cl.$^6$ .................................................. C23C 14/34
[52] U.S. Cl. ................................ 204/298.09; 204/298.12; 204/298.23
[58] Field of Search ...................... 204/298.09, 298.12, 204/298.23, 192.12

[56] References Cited

U.S. PATENT DOCUMENTS

| | | | |
|---|---|---|---|
| 4,515,675 | 5/1985 | Kieser et al. .......................... | 204/298 |
| 4,668,373 | 5/1987 | Rille et al. ........................... | 204/298.12 |
| 4,747,927 | 7/1988 | Rille et al. ........................... | 204/298 |
| 4,966,676 | 10/1990 | Fukasawa et al. ................... | 204/298.12 |
| 5,039,913 | 8/1991 | Wegmann et al. .............. | 204/298.09 X |
| 5,203,980 | 12/1993 | Cremer et al. ..................... | 204/298.08 |
| 5,372,694 | 12/1994 | Szczyrbowski ................ | 204/298.09 X |
| 5,421,978 | 6/1995 | Schuhmacher et al. ........... | 204/298.09 |

*Primary Examiner*—Nam Nguyen
*Attorney, Agent, or Firm*—Felfe & Lynch

[57] ABSTRACT

Individual target segments (A–F), are mounted on a mounting plate by means of locating studs inserted into mounting holes of elongate or circular cross sections in correspondence with the change in length caused by the thermal expansion of the target segments. The segments are retained by screws received in tapped bones in the studs, which are welded to the target backplates. The individual segments (A–F) each consist of a target backplate and a target bonded to the backplate. The perimeter of each backplate over laps the perimeter of each target segment, this overlap amounting to 0.05–0.2 mm when molybdenum or titanium is used for the target backplate and an indium-tin alloy is used for the sputter target.

11 Claims, 3 Drawing Sheets

LARGE AREA SPUTTER CATHODE HAVING FLOATING TARGET SEGMENTS

BACKGROUND OF THE INVENTION

The invention pertains to a heatable plate assembly particularly a sputter cathode having a plurality of target segments consisting of target portions bonded to backplates and mounted on a cathode body.

Cathode devices for use in coating systems are known. These cathode devices consist essentially of a sputter target, which is rigidly connected to a target backplate and eroded during the course of the cathodic atomization process. By means of mounting devices provided on the target backplate, the target backplate is held in position together with the sputter target on a mounting plate, which is designed as a cathode body and which is provided with a cooling device. The surface areas of conventional substrates to be coated by the sputtering technique can be as large as $400 \times 300$ mm$^2$, which requires that the sputter cathode be of similar size.

A disadvantage of the known sputtering systems is that, when a new target must be installed after the old sputter target has been used up, for example, special tools such as lifters are required. Another disadvantage is that in some cases the sputter target cannot be replaced by a single person. In addition, large sputter targets, although desirable in themselves, suffer from the disadvantage that, during the sputtering process, the sputter target and the target backplate are heated by the energy from the plasma in the form of radiation and by the kinetic energy released by the ions which have been accelerated onto the target. The sputter target therefore expands as a function of the heat transferred from the target backplate to the cathode body and as a function of the design of the cooling device provided in the cathode body. As a result of this heating, both the sputter target itself and the target backplate (cathode body) expand. Because the sputter target is normally bonded to the cathode body, the sputter target and the target backplate must be made of metals with the same or similar coefficients of thermal expansion to prevent differences in the extent to which they change in length or area, as illustrated by the behavior of a bimetal strip. This sharply limits the choice of materials.

SUMMARY OF THE INVENTION

The invention simplifies the replacement of the sputter target and eliminates the limitation on the range of materials available for the sputter target and the target backplate.

According to the invention the sputter target is built up of individual segments, each individual segment consisting of a target portion and a backplate which is bonded to the target portion. In the unheated state, the individual segments are assembled onto a mounting plate to form the overall cathode. In the unheated state, the individual segments are at a defined, contact-free distance from one another. During the sputtering process, however, the areas of the individual segments undergo expansion, and the segments come into contact with each other along their sides. Because the perimeter of the target backplate segments is larger than the perimeter of the sputter target segments, the heated segments come into contact with each other only along the sides of the target backplates. Any damage which could occur to the abutting edges of the sputter target as a result of thermal expansion is therefore advantageously avoided. Because, furthermore, the overall plate assembly consists of individual plate segments, no special tools are required to replace the target. The advantage is therefore obtained that the target can be replaced even by a single person working alone.

So that the segments can be mounted, the mounting plate has through-holes of various sizes. The mounting holes in the area where the bisectors of the surface of the cathode body intersect have a circular cross section and their diameter matches the outside diameter of the locating bolts to be used, as a result of which the segments mounted by means of these holes are able to expand essentially only in the radial direction relative to these holes. The mounting holes provided along the perpendicular bisectors have a slot-type cross section, the long axes of these slots extending in the radial direction with respect to the point where the bisectors intersect. With the holes aligned in this way, it is possible for thermally induced longitudinal expansions to be absorbed. The changes in length occurring in the other radial directions (diagonal directions) are absorbed by the other through-holes provided in the cathode body, these other through-holes having a circular cross section, the diameter of which is the same as the length of the slots.

The individual segments are attached by means of locating studs with tapped central holes, these studs being permanently attached to the backplates, preferably by welding. The locating studs fit into the through-holes in the mounting plate and are held in place by means of screws received in the tapped holes. After the studs have been positioned, the screws can be screwed into them from the rear surface of the mounting plate. A sealing ring is inserted as a vacuum seal into a groove provided around the circumference of the contact surface of the head of each screw. This sealing ring brings about a vacuum-tight seal between the surface of the mounting plate facing the target segments and the rear surface of the mounting plate. Because the outside diameter of the locating studs is smaller than the corresponding through-holes, the target segments "float" on the mounting plate; that is, the target is supported in such a way that it is free to move parallel to the surface of the mounting plate. The advantage is therefore obtained that the segments which shift around with respect to each other as a result of thermal expansion are kept essentially free of thermal stress.

The sputter cathode is preferably an indium-tin alloy, and the target backplate consists of molybdenum and/or titanium. The overlap between the target backplate and the sputter target is advantageously 0.05–0.2 mm, and preferably 0.1 mm. Larger overlaps are less advantageous, because the target backplate itself could then be sputtered, which would make it possible for impurities to be introduced into the coating deposited by the sputter cathode.

DETAILED DESCRIPTION OF THE PREFERRED EMBODIMENT

Figure 1:
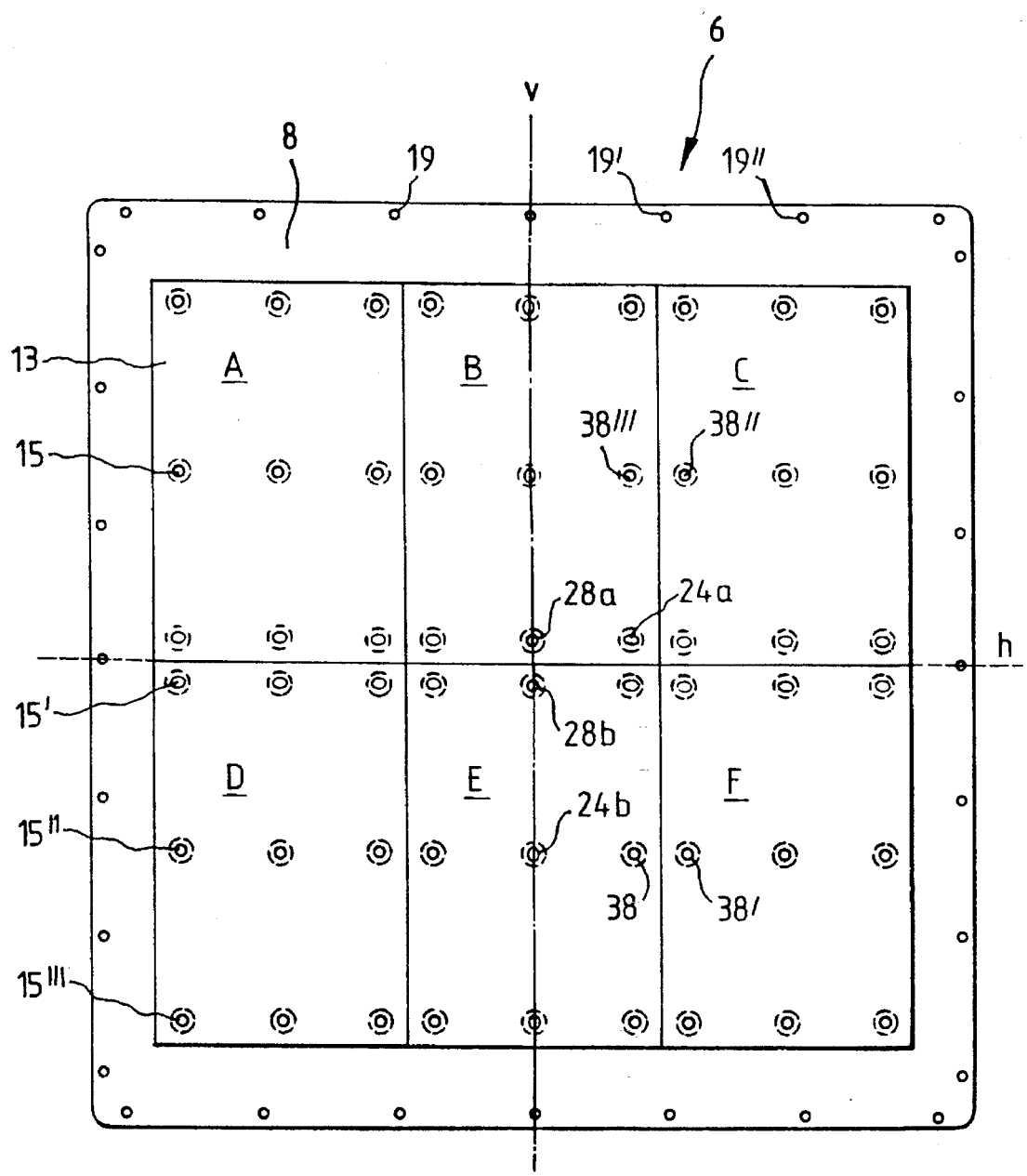
FIG. 1 is a plan view of a mounting plate according to the invention with indication of the positions of segments A–F.
Figure 3:
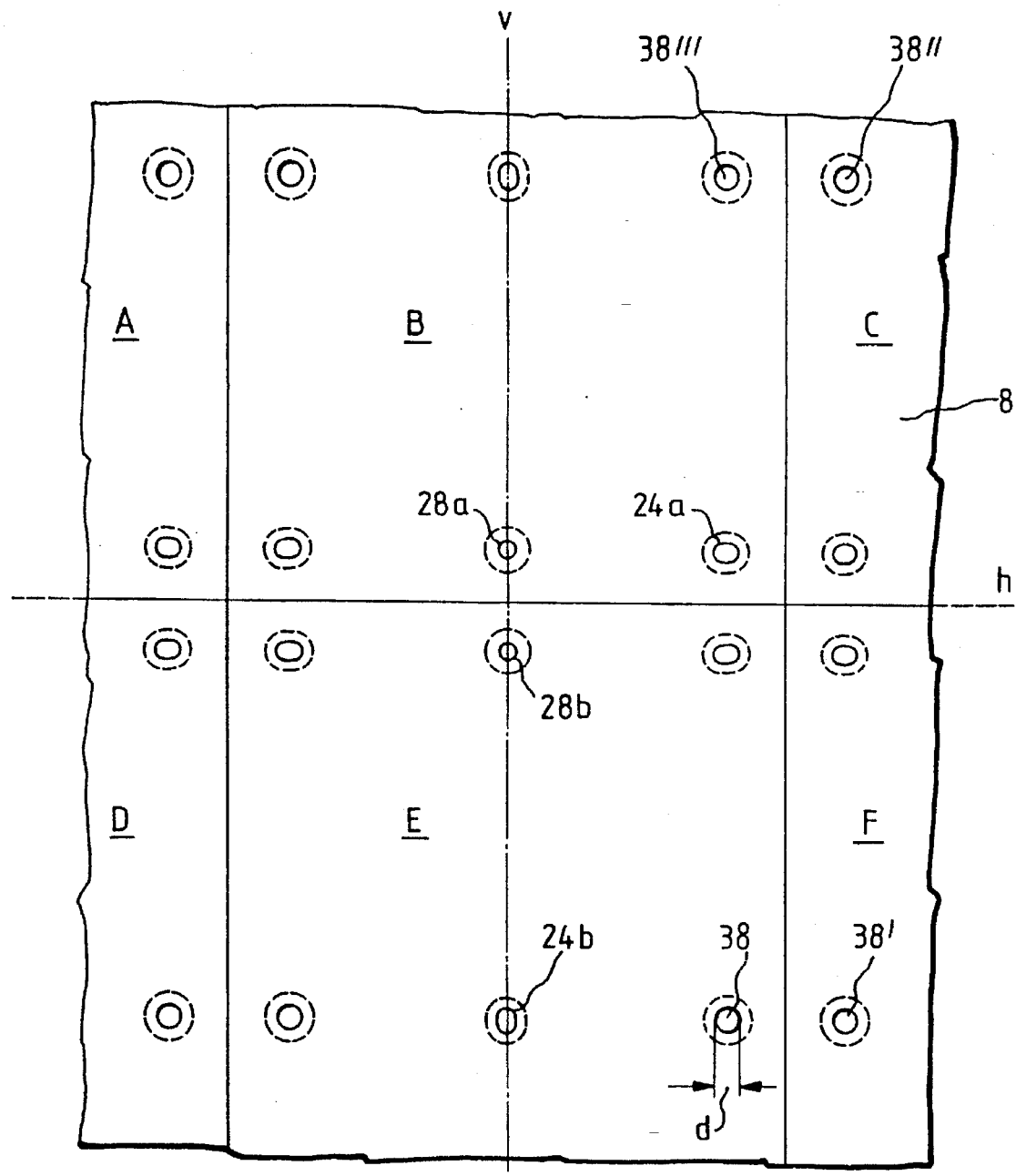
FIG. 3 is an enlarged, partial plan view of the central area of the mounting plate seen in FIG. 1.

FIG. 1 shows an essentially square cathode body in the form of a mounting plate 8 having through-holes 19 in the outer peripheral edge area, which holes are used to hold mounting plate 8 in place. By means of the additional through-holes 15', 15", 15''', 24a, 24b, 28a, 28b, 38, 38', 38", 38''', individual segments A–F forming the overall cathode surface are attached to mounting plate 8. Individual segments A–F are laid next to each other in such a way that they form an essentially square overall target surface. For the mounting of the individual segments, specifically segments B and E, located in the center, mounting holes 24a, 24b, 28a, 28b, 38, 38''' have different cross sections. Through-holes 28a, 28b, located in the narrower central area of the overall cathode sputter target surface, have a circular open cross section (see FIG. 3), into which a locating stud 20 (see FIG. 5) can be inserted with an exact fit. These mounting holes 28a, 28b serve as fixation holes, because, when segments A–F are heated, the relative positions of segments B and E to cathode body 8 change to only an insignificant degree in the area around mounting holes 28a, 28b. With increasing distance from the intersection of bisectors h and v, the surface expansion of segments A–F increases continuously also. To absorb this longitudinal increase and the change in position of segments A–F relative to mounting plate 8, through-holes 24a, 24b are designed as slots essentially parallel to bisectors h and v. These slots 24a, 24b are oriented with their long axes parallel to the direction of expansion of segments A–F. Through-holes 38, 38', 38", 38''' have a circular cross section d (see FIG. 3), the open diameter of which is essentially the same as the length of the long axes of slots 24a, 24b. Other holes on axis v and holes such as 15' adjacent to axis h are elongate, while other holes such as 15, 15", 15''' have circular cross-sections which, like holes 38, 38', 38", 38''', provide clearance around studs 20 as shown FIG. 5.

Figure 2:
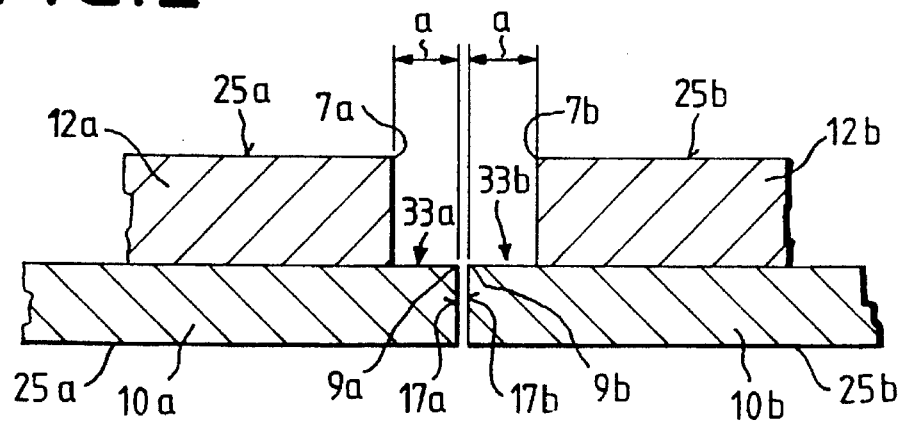
FIG. 2 is a cross section through two adjacent segments.

Segments A–F to be attached to mounting plate 8 consist essentially of two layers, namely, as illustrated in FIG. 2, a target backplate 10a, 10b and a target 12a, 12b, bonded to target backplate 10a, 10b. The target can be made of an indium-tin alloy, for example, and the target backplate can be made of titanium or molybdenum. Target backplate 10a, 10b, overlaps sputter cathode 12a, 12b along the a peripheral area sides by 33a, 33b area of width a, as a result of which, when segments A–F undergo longitudinal expansion under the effects of heat, only backplate side surfaces 17a, 17b are able to press against each other.

Figure 4:
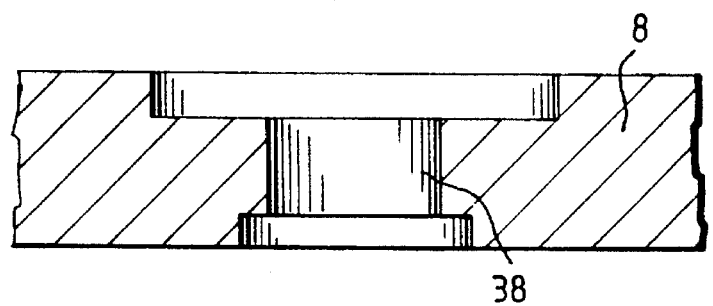
FIG. 4 is a cross section through the mounting plate along line 4—4 of FIG. 3.
Figure 5:
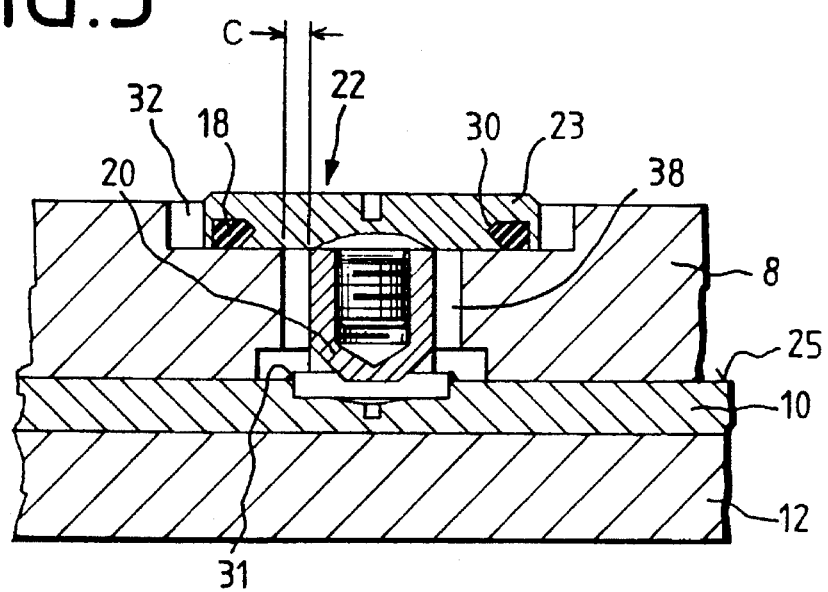
FIG. 5 is an inverted cross section through a sputter target with a backplate in the area of a screw connection, the target being screwed to the mounting plate.

To mount segments A–F, locating bolts 20 are permanently attached by welds 31 to target backplate 10, 10a (see FIG. 5). Backplate 10 is positioned in such a way on mounting plate 8 that locating studs 20 project into the corresponding mounting holes 38 (see FIG. 4), these segments being detachably connected to mounting plate 8 by means of screws 22, which are screwed into locating studs 20. To seal off the vacuum pressure prevailing on the side where the surface of the sputter cathode is against the atmospheric pressure prevailing on the rear surface of the mounting plate, a peripheral groove 30 is provided in head 23 of the screw, into which groove a sealing ring 18 is inserted. When screw 22 is tightened, the head comes to rest by way of this ring on mounting plate 8 to form a vacuum-tight seal. The effective open diameter of mounting hole 38 is, both in the area of screw head 23 and also in the area of locating bolt 20, designed in such a way that target backplate 10, with the sputter target 12 attached to it, is able to slide by a distance c either in only one direction or in any of the directions in two dimensions allowed by through-holes 38, 38', 38", . . .

We claim:

1. A sputtering target assembly comprising a mounting plate, and a plurality of target segments mounted on said mounting plate, each target segment comprising a target backplate and a target portion bonded to said backplate, each backplate having a peripheral area which extends beyond the target portion mounted thereon, said target segments being arranged so that in an unheated state said backplates are not in contact and in a heated state said backplates are in contact.

2. A sputtering target assembly as in claim 1 wherein each backplate is provided with a plurality of locating studs facing away from the target portion, said mounting plate being provided with a plurality of locating holes spaced to receive said studs.

3. A sputtering target assembly as in claim 2 wherein said target segments are rectangular and are mounted in a rectangular array having a center and a pair of mutually perpendicular bisectors passing through said center, said locating holes including at least one fixation hole of circular cross-section which closely receives a locating stud so that thermal expansion is possible only in radial directions extending from said fixation hole.

4. A sputtering target assembly as in claim 3 wherein one of said bisectors defines a boundary between an adjacent pair of target buck plates, each said back plate having a fixation hole in proximity to said center.

5. A sputtering target assembly as in claim 4 wherein said locating holes further comprise elongate fixation holes parallel and closely adjacent to said one of said bisectors, said elongate fixation holes permitting thermal expansion of said segments parallel to said bisectors.

6. A sputtering target assembly as in claim 4 wherein said locating holes further comprise elongate fixation holes on the other of said bisectors.

7. A sputtering target assembly as in claim 3 wherein locating holes remote from said bisectors have circular cross-sections which receive said studs with sufficient clearance to permit thermal expansion in radial directions from said center.

8. A sputtering target assembly as in claim 2 wherein each stud is provided with a threaded coaxial bore, said assembly further comprising screws received in respective bores to fix said target segments to said mounting plate.

9. A sputtering target assembly as in claim 8 wherein said screws have heads provided with sealing means which contact said mounting plate.

10. A sputtering target as in claim 1 wherein said target portions are indium-tin alloy and said backplates are one of molybdenum and titanium.

11. A sputtering target as in claim 1 wherein said peripheral surface area extends beyond said target portion by 0.05–0.2 mm.

\* \* \* \* \*